United States Patent
Liaw

(10) Patent No.: US 10,854,518 B2
(45) Date of Patent: Dec. 1, 2020

(54) CONFIGURING DIFFERENT VIA SIZES FOR BRIDGING RISK REDUCTION AND PERFORMANCE IMPROVEMENT

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/269,747

(22) Filed: Feb. 7, 2019

(65) Prior Publication Data
US 2020/0135569 A1    Apr. 30, 2020

Related U.S. Application Data

(60) Provisional application No. 62/752,446, filed on Oct. 30, 2018.

(51) Int. Cl.
*H01L 21/8234* (2006.01)
*H01L 21/768* (2006.01)

(52) U.S. Cl.
CPC ........ *H01L 21/823425* (2013.01); *H01L 21/76895* (2013.01); *H01L 21/823437* (2013.01); *H01L 21/823475* (2013.01)

(58) Field of Classification Search
CPC ....... H01L 21/823475; H01L 21/76895; H01L 21/823437; H01L 21/823425; H01L 27/0207; H01L 23/5226
See application file for complete search history.

(56) References Cited

U.S. PATENT DOCUMENTS

| | | | |
|---|---|---|---|
| 4,849,804 A | 7/1989 | Mader | |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,952,547 B2 | 2/2015 | Liaw | |
| 9,449,970 B2 | 9/2016 | Do et al. | |
| 9,564,433 B2 | 2/2017 | Liaw | |
| 2010/0052049 A1 | 3/2010 | Lofti et al. | |
| 2011/0215415 A1 | 9/2011 | Gerhardt et al. | |
| 2013/0258759 A1* | 10/2013 | Liaw | G06F 30/392 365/154 |

(Continued)

FOREIGN PATENT DOCUMENTS

JP    2010526437    7/2010

*Primary Examiner* — Nelson Garces
(74) *Attorney, Agent, or Firm* — Haynes and Boone, LLP

(57) ABSTRACT

A first gate structure, a second gate structure, and a third gate structure each extend in a first direction. A first gate via is disposed on the first gate structure. The first gate via has a first size. A second gate via is disposed on the second gate structure. The second gate via has a second size that is greater than the first size. A third gate via is disposed on the third gate structure. The third gate via has a third size that is less than the second size but greater than the first size. A first source contact is disposed adjacent to a first side of the first gate via. A first drain contact is disposed adjacent to a second side of the first gate via opposite the first side. A second drain contact is disposed adjacent to a first side of the third gate via.

20 Claims, 9 Drawing Sheets

(56) References Cited

U.S. PATENT DOCUMENTS

| | | |
|---|---|---|
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2016/0056153 A1* | 2/2016 | Do .................. H01L 27/11807 257/390 |

* cited by examiner

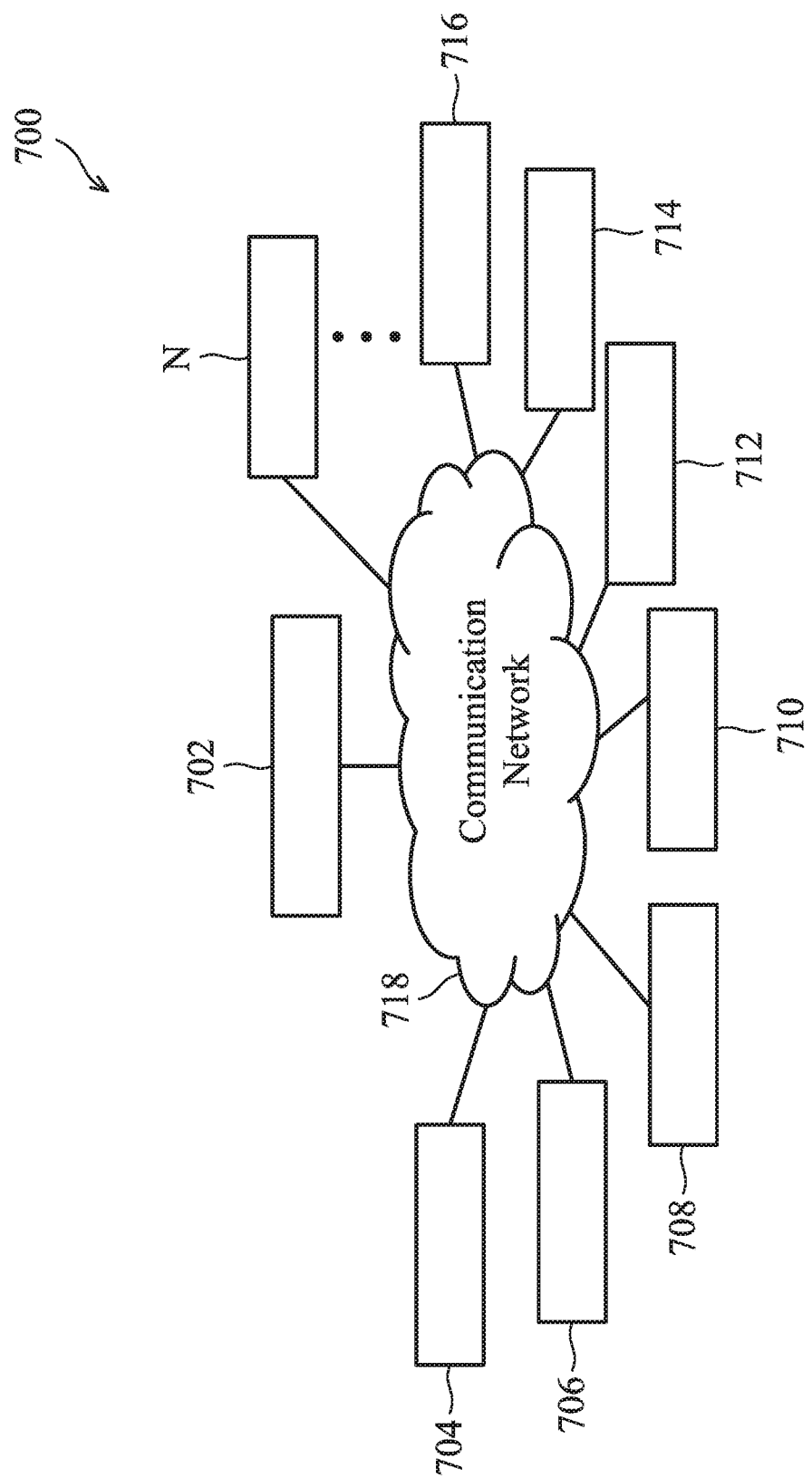

CONFIGURING DIFFERENT VIA SIZES FOR BRIDGING RISK REDUCTION AND PERFORMANCE IMPROVEMENT

PRIORITY DATA

The present application is a utility application of Provisional U.S. Pat. App. No. 62/752,446, filed on Oct. 30, 2018, entitled "INTEGRATED CIRCUIT CONNECTION STRUCTURE WITH DIFFERENT TYPES OF GATE VIAS/CONTACTS", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As semiconductor feature sizes shrink, electrical bridging (e.g., electrical shorting between microelectronic components) may become a concern. To prevent electrical bridging, the microelectronic components may be placed farther apart from one another. However, the greater spacing among microelectronic components leads to routing inefficiencies and decreased functional density.

Therefore, although existing semiconductor IC devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 9 illustrates a semiconductor fabrication facility according to embodiments of the present disclosure.

DETAILED DESCRIPTION

Figure 1:
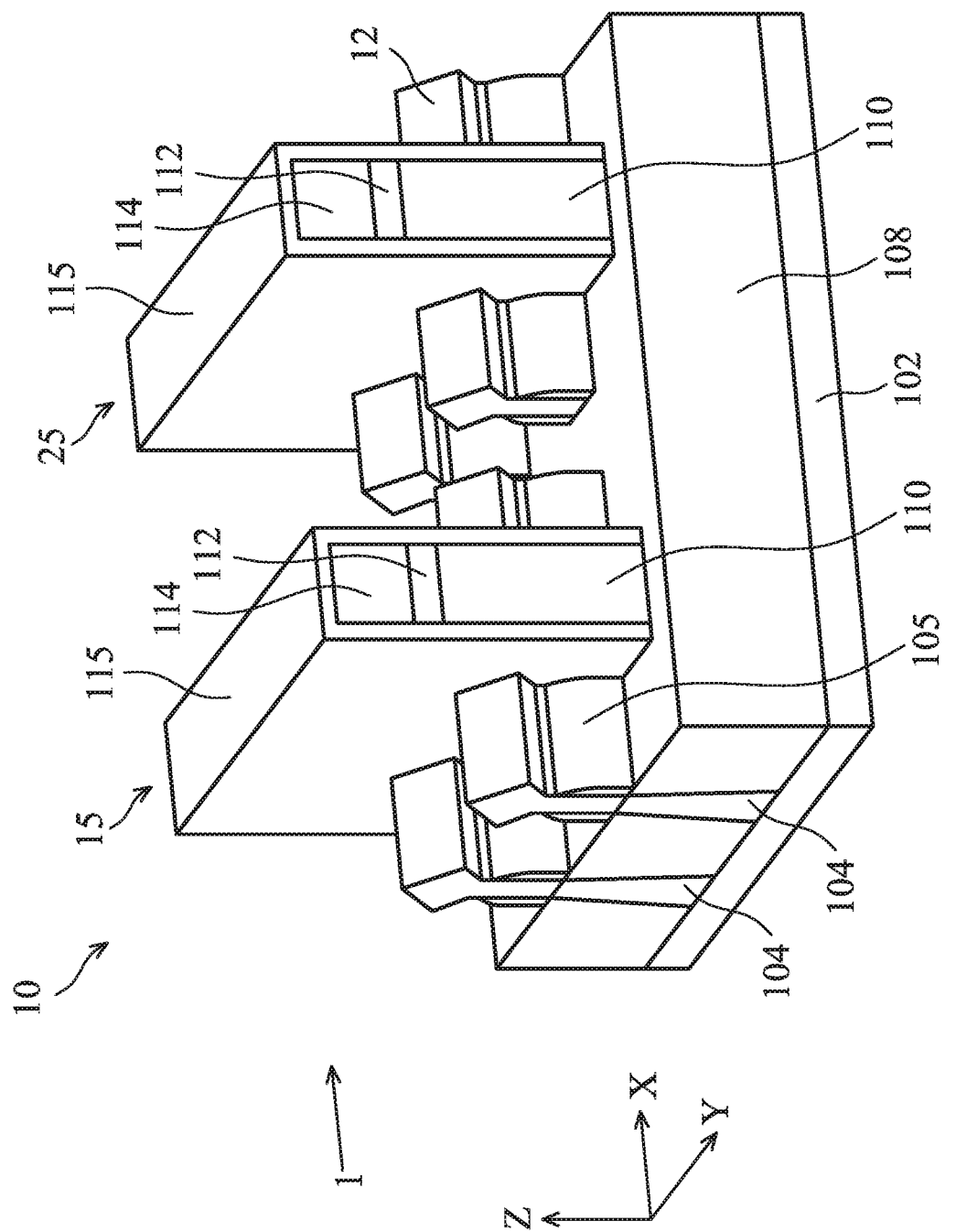
FIG. 1 illustrates a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As semiconductor device sizes continue to get scaled down, electrical bridging between various IC microelectronic components may become a greater concern. For example, a gate contact may physically touch slot contacts or vias, thereby causing electrical shorting between the gate contact and slot contacts or vias. Unintentional electrical bridging may degrade device performance or lead to device failures. In order to prevent electrical bridging, conventional IC design and/or layout schemes have tried to place the components that are at risk for bridging (e.g., gate contact and slot contact or vias) farther away from one another. However, doing so may decrease functional density and/or lead to metal routing inefficiencies.

To overcome the problems discussed above, the present disclosure pertains to novel and non-obvious schemes to place the gate vias and source/drain vias, as discussed below in more detail with reference to FIGS. 1-9.

It is understood that embodiments of the present disclosure may apply to a plurality of types of ICs and/or transistors. For example, the present disclosure may apply to planar devices, a fin-like field-effect transistor (FinFET) devices (which may be a two-dimensional structure or a three-dimensional structure), vertical gate-all-around (GAA) devices, horizontal GAA devices, nano-wire devices, nano-sheet devices, or combinations thereof. For the sake of providing an example, an example FinFET device is illustrated in FIG. 1. However, it is understood that the application should not be limited to a particular type of device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epitaxially-grown material 12, which may (along with portions of the fin structure 104) serve as the source/drain of the FinFET device structure 10. In some embodiments, for an NFET, the epitaxially-grown material may include SiP, SiC, SiPC, SiAs, Si, or combinations thereof. In some embodiments, for a PFET, the epitaxially-grown material may include SiGe, SiGeC, Ge, Si, a boron-doped material, or combinations thereof.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

Figure 2:
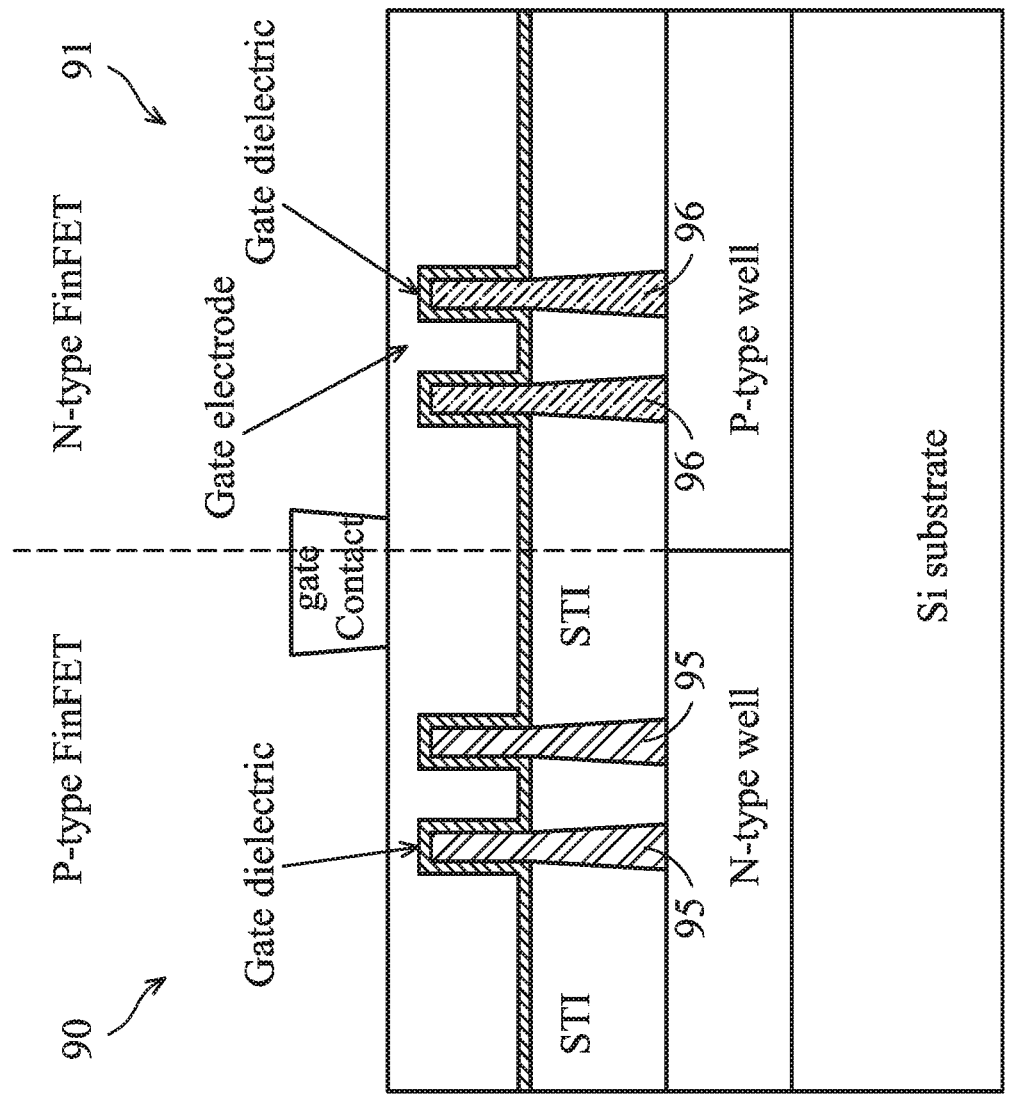
FIG. 2 illustrates a diagrammatic cross-sectional side view of an example FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. Various aspects of the present disclosure are discussed below using ICs that are implemented via FinFET device. However, it is understood that this is merely for the purposes of providing an example, and that the present disclosure is not limited to FinFET devices and may apply to planar devices, GAA devices, nano-wire devices, or nano-sheet devices, etc.

Figure 3:
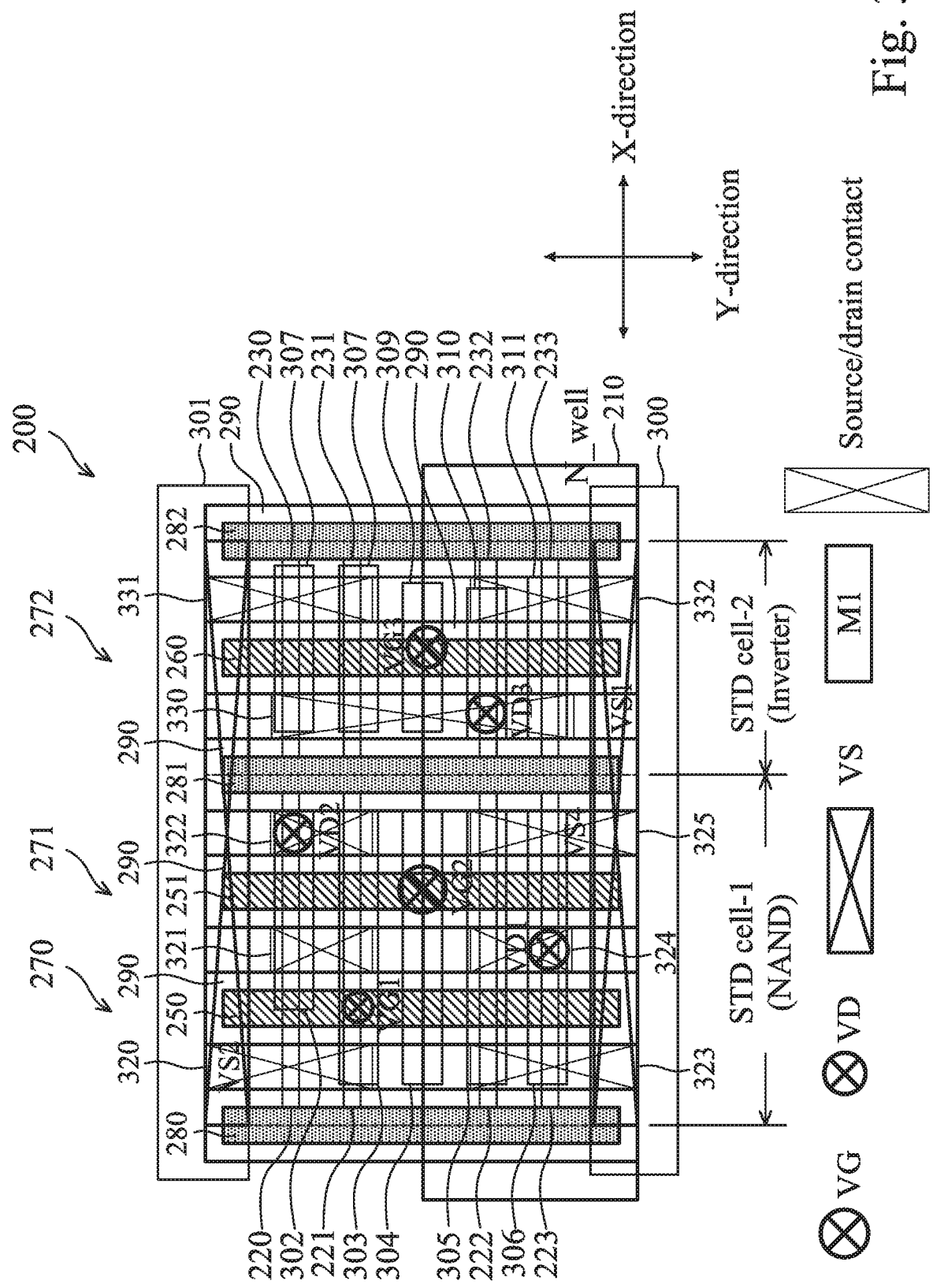
FIGS. 3-4 illustrate top views of a portions of logic circuits according to embodiments of the present disclosure.

FIG. 3 is a diagrammatic fragmentary top view of a portion of an IC device 200 according to an embodiment. The IC device 200 may include a plurality of circuit cells, for example memory cells such as static random access memory (SRAM) cells, and/or standard circuit cells (also referred to as STD cells). The STD cells may include logic circuits or logic devices, including but not limited to logic circuits such as inverters, NAND gates, NOR gates, flip-flops, or combinations thereof. For the sake of providing an example, two STD cells are illustrated in FIG. 3: STD cell-1, which includes a NAND gate, and STD cell-2, which includes an inverter. Portions of the STD cell-1 and the STD cell-2 may be formed over a doped well, for example an N well 210. It is understood that the STD cell-1 (including the NAND gate) and the STD cell-2 (including the inverter) are merely examples. The present disclosure applies to other types of STD cells as well, for example cells including NOR gates, AND gates, OR gates, flip-flops, other gates having specific logic functions, or combinations thereof.

The STD cell-1 includes a plurality of fin structures 220-223, and the STD cell-2 includes a plurality of fin structures 230-233. The fin structures 220-223 and 230-233 each extend in an elongated manner in the X-direction and may be embodiments of the fin structure 104 of FIG. 1 or the fins 95 or fins 96 of FIG. 2.

The STD cell-1 includes a plurality of gate structures 250-251, and the STD cell-2 includes a gate structure 260. The gate structures 250-251 and 260 each extend in an elongated manner in the Y-direction and may include an embodiment of the gate electrode 110 of FIG. 1, as well as gate dielectric layers. Also as discussed above with reference to FIGS. 1-2, the gate structures 250-251 and 260 each partially wrap around the top and side surfaces of the fin structures 220-223 and 230-233 and thereby form different transistors 270-272. The portions of the fin structures 220-223 and 230-233 underneath the gate structures 250-251 and 260 comprise the channel regions of the transistors 270-272, whereas the portions of the fin structures 220-223 and 230-233 outside the gate structures 250-251 and 260 comprise the source regions and drain regions of the transistors 270-272. The gate structures 250-251 and 260 may also include a nitride layer or a high-k dielectric layer located thereupon in some embodiments.

The IC device 200 includes dummy gate structures 280-282. The dummy gate structures 280-282 also each extend in an elongated manner in the Y-direction (e.g., parallel to the gate structures 250-251 and 260). Unlike the gate structures 250-251 and 260, however, the dummy gate structures 280-282 are not functional gate structures (e.g., do not contain gate electrodes). Instead, the dummy gate structures 280-282 may be made of electrically insulating materials (e.g., dielectric materials) to provide electrical isolation between various embodiments of the IC 200. In the embodiment illustrated in FIG. 3, the dummy gate structures 280-282 provide electrical isolation for the fin structures 220-223 and 230-233. The dummy gate structures 280-282 are described in more detail in U.S. Pat. Nos. 9,613,953, 9,805,985, and 9,793,273, the contents of each of which are hereby incorporated by reference in their respective entireties.

Gate spacers 290 may be formed around the gate structures 250-251 and 260 and the dummy gate structures 280-282. The gate spacers 290 may include a dielectric material such as silicon oxide, silicon nitride, silicon oxynitride, a low-k dielectric material (e.g., a dielectric material having a dielectric constant lower than about 4), or combinations thereof.

The IC device 200 includes a multi-layered interconnect structure that contains metal lines and vias to electrical interconnect various components of the IC together. FIG. 3 illustrates various metal lines 300-311 from the bottom interconnect layer—referred to as a M1 (or metal-1) layer—of the multi-layered interconnect structure. The metal lines 300-311 may each extend in an elongated manner in the X-direction. The metal lines 300-301 may extend across both the STD cell-1 and the STD cell-2 and may include metal lines for electrical power rails. For example, the metal line 300 may include a metal line for a Vdd power rail, and the metal line 301 may include a metal line for a Vss power rail. The metal lines 302-306 each intersect with the gate structures 250-251 in the top view in the STD cell-1, and the metal lines 307-311 each intersect with the gate structure 260 in the top view in the STD cell-2. In addition, the metal lines 302-306 overlap with the fin structures 220-223, respectively, and the metal lines 307-311 overlap with the fin structures 230-233, respectively. As such, electrical interconnections may be made between the metal lines 300-311 and the gate structures 250-251 and 260 and the fin structures 220-223 and 230-233.

The STD cell-1 includes contacts 320-325, and the STD cell-2 includes slot contacts 330-332. The slot contacts 320-325 and 330-332 each include one or more electrically conductive layers. For example, the electrically conductive layers may include Ti, TiN, Pt, Co, Ru, W, TaN, Cu, or combinations thereof. The slot contacts 320-325 and 330-332 each extend in an elongated manner in the Y-direction. In the top view, the slot contacts 320-322 intersect with the fin structures 220-221, the slot contacts 323-325 intersect with the fin structures 222-223, the slot contact 330 intersects with the fin structures 230-233, the slot contact 331 intersects with the fin structures 230-231, and the slot contact 332 intersects with the fin structures 232-233. The portions of the fin structures 220-223 and 230-233 being intersected are the source/drain regions, and thus the slot contacts 320-325 and 330-332 are capable of providing electrical connectivity to the source/drain regions.

In the embodiment shown in FIG. 3, the slot contacts 320, 323, 325, and 331-332 are source contacts (i.e., providing electrical connectivity to the source) and may be hereinafter interchangeably referred to as source contacts, while the slot contacts 321-322, 324, and 330 are drain contacts (i.e., providing electrical connectivity to the drain) and may be hereinafter interchangeably referred to as drain contacts. Note that the source contacts 320, 323, 325, and 331-332 are longer (e.g., by at least 1.5 times) than the drain contacts 321-322 and 324 in the Y-direction. However, the drain contact 330 is longer than the source contacts 320, 323, 325, and 331-332 in the Y-direction.

The IC device 200 includes gate vias VG1-VG2 in the STD cell-1, and a gate via VG3 in the STD cell-2. The gate vias VG1-VG3 provide electrical connectivity to the gates of transistors 270-272 and thus may also be interchangeably referred to as gate vias VG1, VG2, VG3, respectively. For example, the gate vias VG1-VG3 may each include one or more conductive materials. For example, the electrically conductive materials may include Ti, TiN, Pt, Co, Ru, W, TaN, Cu, or combinations thereof.

The gate via VG1 is located over a channel region of the transistor 270 and provides electrical connectivity between the gate structure 250 (which is located below the gate via VG1) and the metal line 303 (which is located above the gate via VG1). The gate via VG2 is located over an isolation region (e.g., outside of any of the fin structures) and provides electrical connectivity between the gate structure 251 (which is located below the gate via VG2) and the metal line 304 (which is located above the gate via VG2). The gate via VG3 is also located over an isolation region (e.g., outside of any of the fin structures) and provides electrical connectivity between the gate structure 260 (which is located below the gate via VG3) and the metal line 309 (which is located above the gate via VG3). Thus, the gate vias VG1-VG3 each provide electrical connectivity for a different one of the transistors 270-272.

According to the various aspects of the present disclosure, the locations of the slot contacts 320-325 and/or 330-332 relative to the gate vias VG1-VG3 may be correlated to the size and/or disposition of the gate vias VG1-VG3. In more detail, in the case of the gate via VG1, there are slot contacts on either side of it: the slot contact 320 is located to the "left" side of the gate via VG1, and the slot contact 321 is located to the "right" side of the gate via VG1. In other words, the gate via VG1 is a type of gate via that is located adjacent to two slot contacts. It is understood that in the context of the present disclosure, for two elements to be considered to be located adjacent to one another, they do not necessarily need to be located within a certain distance from one another. In the case of the gate via VG1, the slot contact 320 is the closest slot contact to its "left", and the slot contact 321 is the closet slot contact to its "right", and thus the slot contacts 320 and 321 are considered to be located adjacent to the gate via VG1 on its "left" side and "right" side, respectively. Meanwhile, the slot contact 322 (as an example slot contact that is not considered to be located adjacent to the gate via VG1) is separated from the gate via VG1 by at least the slot contact 321, and thus the slot contact 322 is not located adjacent to the gate via VG1. In order to enhance an isolation margin (or alternatively stated, to minimize the risk of electrical bridging), the gate via VG1 has the smallest size among the gate vias VG1-VG3. For example, the small size of the gate via VG1 allows it to shift to the "left" or "right" (e.g., due to lithography or other fabrication process imperfections) in the X-direction without coming into physical contact with the adjacent slot contacts 320 or 321. In some embodiments, the dimension of the gate via VG1 is smaller than the dimension of the gate structure 250 in the X-direction. For example, as shown in FIG. 3, the boundaries of the gate via VG1 may be located within the boundaries of the gate structure 250 in the top view.

In comparison, in the case of the gate via VG2, there are no slot contacts located adjacent to either the "left" side or the "right" side of the gate via VG2. The slot contacts 321-322 and 324-325 are not considered to be located adjacent to the gate via VG2 because any imaginary X-directional line that crosses the gate via VG2 does not intersect with the slot contacts 321-322 or 324-325. The lack of adjacently-located slot contacts allows the gate via VG2 to have the largest size among the gate vias VG1-VG3, since the gate via VG2 can shift "left" or "right" in the X-direction without causing electrical bridging. In some embodiments, an area of the gate via VG2 is larger than about 1.2 times of an area of the gate via VG1, which may be attributed to the gate Via VG2's larger dimensions (larger than that of the gate Via VG1) in the X-direction and/or in both the X-direction and the Y-direction. In some embodiments, the dimension of the gate via VG2 is larger than the dimension of the gate structure 251 in the X-direction. For example, as shown in FIG. 3, the boundaries of the gate via VG2 may be located slightly outside of the boundaries of the gate structure 251 in the top view. The relatively large size of the gate via VG2 allows it to achieve a small electrical resistance, which helps optimize IC performance such as speed.

In the case of the gate via VG3, there is the slot contact 330 located adjacent to the "left" side of the gate via VG3, but no slot contact located adjacent to the "right" side of the gate via VG3. The slot contact 330 is considered to be located adjacent to the "left" side of the gate via VG3 because it is the closet slot contact to the "left" of the gate via VG3, and an imaginary X-directional line that crosses the gate via VG3 will also intersect with the slot contact 330. On the other hand, the slot contacts 331-332 are not considered to be located adjacent to the "right" side of the gate via VG3 because any imaginary X-directional line that crosses the gate via VG3 will not intersect with the slot contact 331 or 332. In order to enhance an isolation margin, the gate via VG3 is larger than the gate via VG1 but smaller than the gate via VG2, since the gate via VG3 can be shifted to the "right" (but not to the left, due to the presence of the slot contact 330) without causing electrical bridging with an adjacently-located slot contact. In some embodiments, an area of the gate via VG2 is larger than about 1.1 times of an area of the gate via VG3, which may be attributed to the gate via VG2's larger dimensions (larger than that of the gate Via VG3) in the X-direction and/or in both the X-direction and the Y-direction. The area of the gate via VG3 is still larger than the area of the gate via VG1, since the gate via VG3 only has a slot contact 330 disposed on its left side but not the right side, whereas the gate via VG1 has slot contacts 320 and 321 disposed on both sides.

In some embodiments, the dimension of the gate via VG3 is larger than the dimension of the gate structure 260 in the X-direction. In addition, since the gate via VG3 has a slot contact 330 on its "left" side but not on its "right" side, the gate via VG3 may be "shifted" to the "right" on purpose. In other words, the center of the gate via VG3 may not be aligned or centered with respect to the center of the gate structure 260. Instead, the center of the gate via VG3 may be located to the "right" of the center of the gate structure 260 in the X-direction. Alternatively stated, the left side boundaries of the gate via VG3 may be located within the left boundaries of the gate structure 260, but the right side boundaries of the gate via VG3 may be located outside of the right boundaries of the gate structure 260. Such a design of the gate via VG3 allows it to simultaneously achieve reduced resistance (since its size is enlarged in at least one direction) as well as reduced electrical bridging risks (since the shifting of the gate via VG3 away from the slot contact 330 helps minimize the risk of the gate via VG3 coming into physical contact with the slot contact 330).

There are various ways to implement the gate vias VG1-VG3 to facilitate their different sizes and/or locations. In some embodiments, the IC chip designers and/or layout engineers may configure the IC chip layout such that the gate vias VG1-VG3 may achieve the relative sizes as discussed above, for example the size of the gate via VG2 being greater than the size of the gate via VG3, and the size of the gate via VG3 being greater than the size of the gate via VG1. However, it is understood that due to real world fabrication process imperfections (or even acceptable tolerances in process windows), the sizes of the gate vias VG1-VG3 in actually fabricated devices may exhibit variations in their respective sizes, which could lead to the relative sizes of the actually fabricated gate vias VG1-VG3 not meeting the relative size conditions specified according to the IC chip layout design. For example, although the IC chip layout design may call for the size of the gate via VG2 to be greater than the size of the gate via VG3, the gate via VG2 in the actually fabricated device may have a smaller size than the size of the gate via VG3. The IC chip designer engineer or layout engineer can also move the location of any of the gate vias VG1-VG3, for example by moving the location of the gate via VG3 such that it is moved to the right of the center of the gate structure 260 (away from the slot contact 330). Again, as a result of real world fabrication, it is understood that the locations of the gate vias VG1-VG3 in the actually fabricated device may not be in locations specified according to the initial IC chip layout design.

In other embodiments, the IC chip design engineers and/or layout engineers need not specifically configure the sizes or locations of the gate vias VG1-VG3 according to the aspects of the present disclosure discussed above. Instead, the configuring of the gate vias VG1-VG3 may be done by the fab or manufacturing entity of the IC. For example, a fab may receive the IC layout design from an IC design house. The IC layout design may be in the form of a digital file, such as a file in a Graphic Database System (GDS) format. The gate vias VG1-VG3 may initially have the same (or substantially similar) sizes in the original IC layout design. The engineers at the fab may revise or modify the GDS file, for example by resizing the gate vias VG1-VG3 and/or by moving their locations in accordance with the various aspects of the present disclosure. In some embodiments, assistant features such as optical proximity correction (OPC) features may be utilized to modify the shape, size, and/or location of the gate vias VG1-VG3. Again, although the modified IC layout design may specify the relative sizes and/or locations of the gate vias VG1-VG3 in the manner described above with reference to FIG. 3, real world fabrication processing may lead to variations in their sizes and locations, such that the actually fabricated device may not necessarily meet the relative size and/or location conditions associated with the gate vias VG1-VG3 specified by the modified IC layout design.

In addition to the gate vias VG1-VG3, which provide electrical connectivity to the gate structures 250-251 and 260 of different transistors, the IC device 200 also includes a plurality of drain vias that provide electrical connectivity to the drain regions of the transistors. For example, a drain via VD1 electrically couples together the drain contact 324 and the metal line 306, a drain via VD2 electrically couples together the drain contact 322 and the metal line 302, and a drain via VD3 electrically couples together the drain contact 330 and the metal line 310. The drain contacts 324, 322, and 330 are disposed below the drain vias VD1, VD2, and VD3, while the metal lines 306, 302, and 310 are disposed above the drain vias VD1, VD2, and VD3, respectively. In some embodiments, the drain vias VD1, VD2, and VD3 each have a rounded top view profile, for example a substantially circular top view profile. In other embodiments, the drain vias VD1, VD2, and VD3 may each have a substantially elliptical top view profile, where the elliptical top view profile includes a long axis and a short axis. In some embodiments, a ratio of the long axis and the short axis is greater than 1:1 but less than 1.2:1.

The IC device 200 further includes a plurality of source vias that provide electrical connectivity to the source regions of the transistors. For example, a source via VS1 spans across the STD cell-1 and the STD cell-2 in the X-direction and electrically couples together the source contacts 323, 325, and 332 with the metal line 300. The source contacts 323, 325, and 332 are disposed below the source via VS1, while the metal line 300 is disposed above the source via VS1. Another source via VS2 also spans across the STD cell-1 and the STD cell-2 in the X-direction and electrically couples together the source contacts 320 and 331 with the metal line 301. The source contacts 320 and 331 are disposed below the source via VS2, while the metal line 301 is disposed above the source via VS2.

Unlike the drain vias VD1, VD2, and VD3, however, the source vias VS1 and VS2 each have a line-like or rectangular top view profile, where they are each elongated in the X-direction. In some embodiments, the dimension of the source via VS1 or VS2 in the X-direction exceeds the dimension of the source via VS1 or VS2 in the Y-direction by a factor of at least 10. Alternatively stated, a ratio of the X-dimension and the Y-dimension of the source via VS1 or VS2 is greater than about 10:1. A larger size of the source vias VS1 and VS2 also helps to reduce their resistance, which optimizes device performance.

Figure 4:
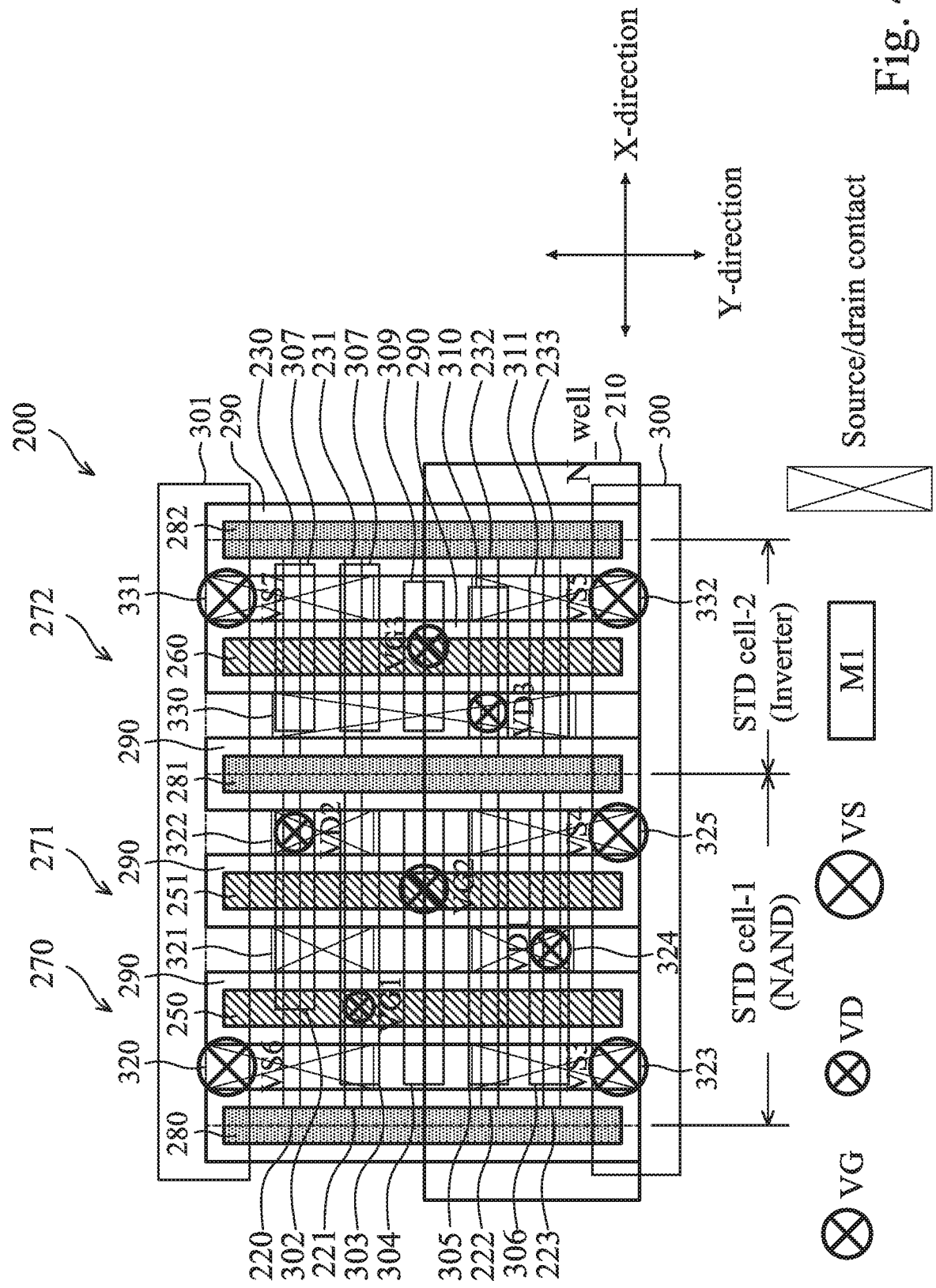
Figure 5:
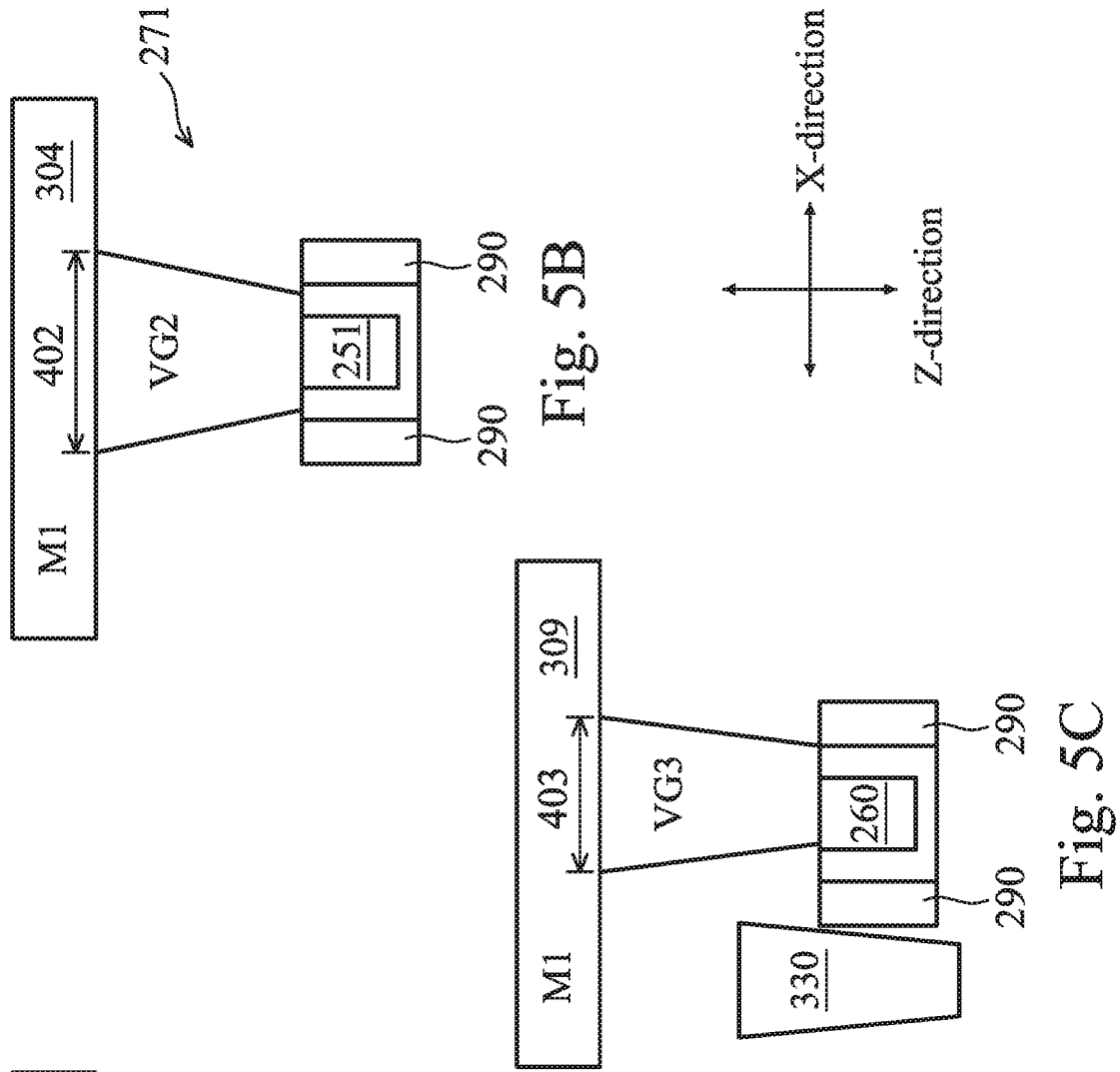
FIGS. 5A-5C illustrate diagrammatic fragmentary cross-sectional side views of portions of the devices of FIGS. 3-4 according to embodiments of the present disclosure.

FIG. 4 is a diagrammatic fragmentary top view of a portion of an IC device 200 according to an alternative embodiment. For reasons of consistency and clarity, similar components appearing in both FIGS. 3-4 are labeled the same. The embodiment of FIG. 4 shares similarities with the embodiment of FIG. 3, for example by having differently-sized gate vias VG1, VG2, and VG3. The gate via VG1 is the smallest out of the gate vias VG1-VG3, since it has slot contacts 320-321 located adjacent thereto on either side. The gate via VG2 is the largest of the gate vias VG1-VG3, since it does not have slot contacts located adjacent thereto on either side. The gate via VG3 is larger than the gate via VG1 but smaller than the gate via VG2, since it has a slot contact 330 located adjacent to its "left" side but no to its "right" side. The location of the gate via VG3 is also shifted to the "right" (or away from the slot contact 330), so as to further minimize bridging risks.

Unlike the embodiment of FIG. 3, however, the embodiment shown in FIG. 4 does not have elongated source vias VS1 or VS2 that span both the STD cell-1 and the STD cell-2. Instead, the embodiment of FIG. 4 has a plurality of source vias VS3-VS7 that are individually electrically coupled to the source contacts. In more detail, the source via VS3 is located above the source contact 323 and below the metal line 300 and thus electrically couples them together. The source via VS4 is located above the source contact 325 and below the metal line 300 and thus electrically couples them together. The source via VS5 is located above the source contact 332 and below the metal line 300 and thus electrically couples them together. The source via VS6 is located above the source contact 320 and below the metal line 301 and thus electrically couples them together. The source via VS7 is located above the source contact 331 and below the metal line 301 and thus electrically couples them together.

The sizes of the source vias VS3-VS7 are also configured to be larger than the sizes of the drain vias VD1-VD3. In some embodiments, an area (in a top view) of any of the source vias VS3-VS7 is at least 1.1 times of the area of any of the drain vias VD1-VD3, since the source vias VS3-VS7 are less likely to cause bridging problems than the drain vias VD1-VD3. The larger sizes of the source vias VS3-VS7 also offer reduced resistance.

FIGS. 5A, 5B, and 5C illustrate diagrammatic fragmentary cross-sectional views of different portions of the IC device 200. The horizontal direction in FIGS. 5A-5C corresponds to the X-direction discussed above, and the vertical direction in FIGS. 5A-5C corresponds to the Z-direction of FIG. 1. For reasons of clarity and consistency, components appearing in both FIGS. 3 and 5A-5C will be labeled the same.

In more detail, FIG. 5A illustrates the portion of the transistor 270 proximate to the gate via VG1. FIG. 5B illustrates the portion of the transistor 271 proximate to the gate via VG2. FIG. 5C illustrates the portion of the transistor 272 proximate to the gate via VG3. Each gate via VG1-VG3 may have a cross-sectional profile that is wider at the top and narrower at the bottom, thereby resembling a trapezoid. In other words, the sidewalls of the gate vias VG1-VG3 are slanted inward from the top to the bottom.

As shown in FIG. 5A, the gate via VG1 is disposed directly on the gate structure 250. The metal line 303 in the M1 metal layer is disposed directly above the gate via VG1. Thus, the gate via VG1 electrically couples together the gate structure 250 and the metal line 303. The source contact 320 is located adjacent to the gate via VG1 on its left side, and the drain contact 321 is located adjacent to the gate via VG1 on its right side. The source contact 320 is formed on a source region 221A (part of the fin structure 221 of FIG. 3) of the transistor 270. The drain contact 321 is formed on a drain region 221B (also a part of the fin structure 221 of FIG. 3) of the transistor 270.

As shown in FIG. 5B, the gate via VG2 is disposed directly on the gate structure 251. The metal line 304 in the M1 metal layer is disposed directly above the gate via VG2. Thus, the gate via VG2 electrically couples together the gate structure 251 and the metal line 304. No source contact or drain contact is located adjacent to either side of the gate via VG2.

As shown in FIG. 5C, the gate via VG3 is disposed directly on the gate structure 260. The metal line 309 in the M1 metal layer is disposed directly above the gate via VG3. Thus, the gate via VG3 electrically couples together the gate structure 260 and the metal line 309. The drain contact 330 is located adjacent to the gate via VG3 on its left side, but no slot contact is located adjacent to the gate via VG3 on its right side. As discussed above with reference to FIG. 3, the drain contact 330 is elongated in the Y-direction and is electrically coupled to certain drain regions, such as drain regions of the fin structures 230-233. However, the portion of the drain contact 330 shown in FIG. 5C is disposed over an isolation structure, for example a shallow trench isolation (STI) structure. Hence, there is no drain region below the drain contact 330 in FIG. 5C.

As discussed above, due to the presence of the slot contacts 320-321 on both sides of the gate via VG1, the gate via VG1 has the smallest size out of the three gate vias VG1-VG3. The gate via VG2 has no slot contacts on either side, and thus the gate via VG2 has the largest size out of the three vias VG1-VG3. The gate via VG3 has a slot contact (e.g., the drain contact 330) on one side but not the other, and thus the gate via VG3 has size greater than the gate via VG1 but less than the gate via VG2. For example, the gate vias VG1-VG3 have maximum lateral dimensions 401-403, respectively, which may be measured at the top surfaces of the gate vias VG1-VG3. The maximum lateral dimension 401 is less than the maximum lateral dimension 403, and the maximum lateral dimension 403 is less than the maximum lateral dimension 402. In some embodiments, a ratio of the dimension 402 and the dimension 401 is in a range between about 1.2:1 and about 2:1. In some embodiments, a ratio of the dimension 403 and the dimension 401 is in a range between about 1.1:1 and about 1.5:1. In some embodiments, a ratio of the dimension 402 and the dimension 403 is in a range between about 1.1:1 and about 1.5:1. In some embodiments, the dimension 401 is in a range between about 5 nm and about 20 nm, the dimension 402 is in a range between about 6 nm and about 40 nm, and the dimension 403 is in a range between about 5.5 nm and about 30 nm.

The relative ratio ranges and numeric value ranges of the maximum lateral dimensions 401-403 are configured to alleviate electrical bridging risks, while reducing electrical resistance when possible (e.g., by making the maximum lateral dimension 403 the largest). In addition, as shown in FIG. 5C, the gate via VG3 is shifted to the right with respect to the center of the gate structure 260. In other words, the gate via VG3 is shifted in an X-direction away from the drain contact 330, so as to further reduce bridging risks with the drain contact 330. Since there is no slot contact to the right of the gate via VG3, the shifting of the gate via VG3 does not create additional bridging risks.

Figure 6:
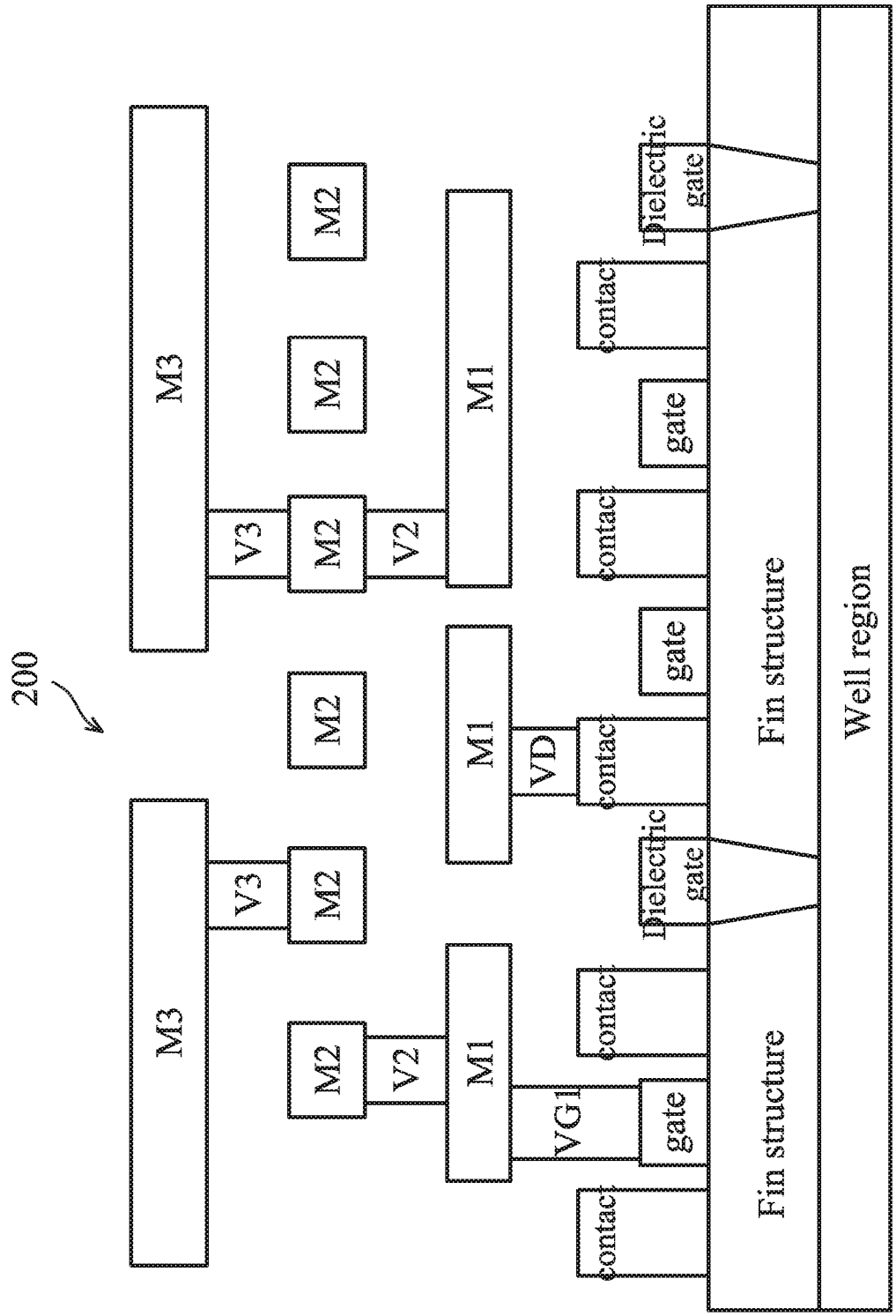
FIGS. 6-7 illustrate diagrammatic fragmentary cross-sectional side views of portions of the devices of FIGS. 3-4 according to embodiments of the present disclosure.
Figure 7:
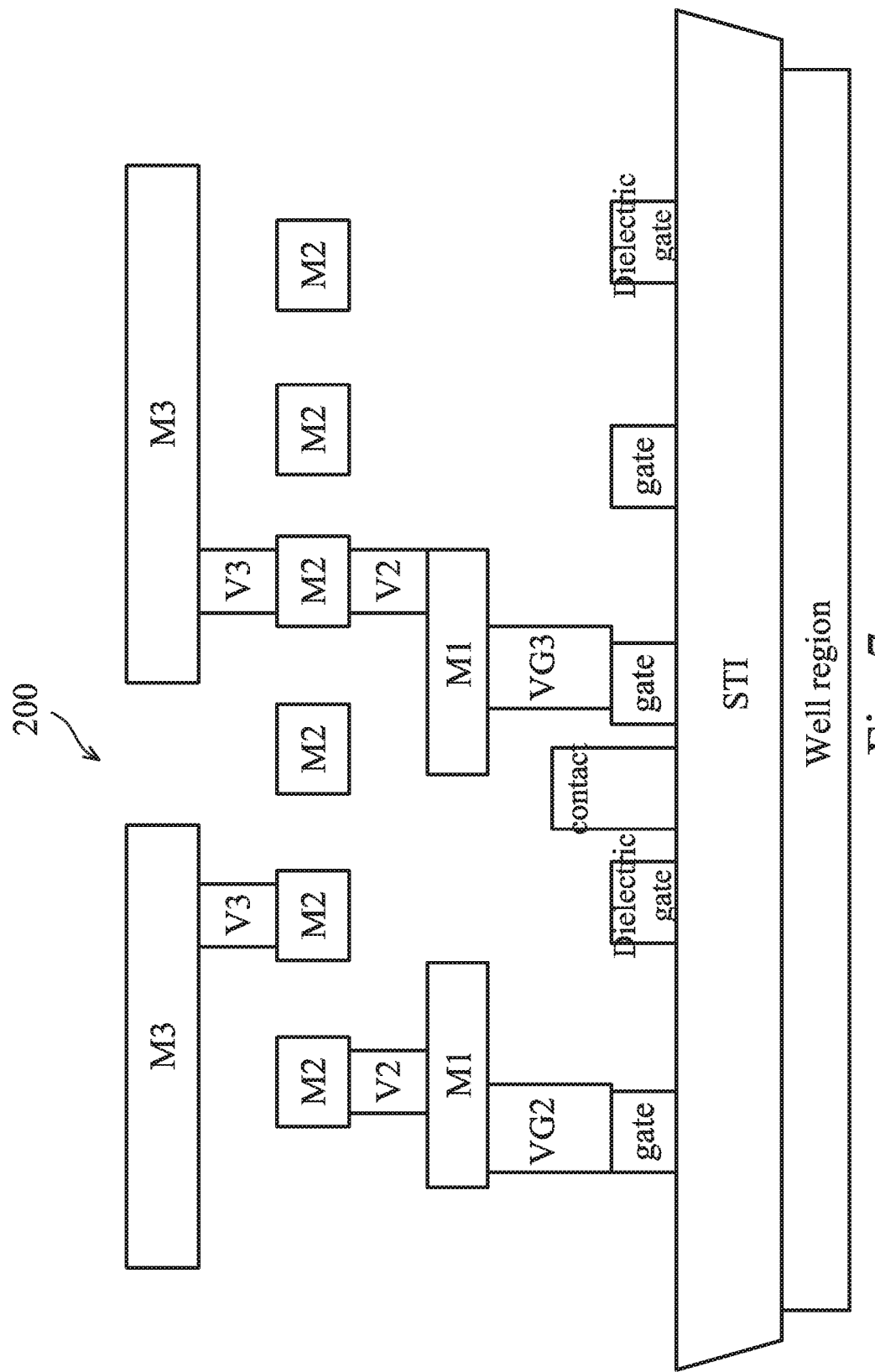

FIGS. 6 and 7 illustrate additional diagrammatic fragmentary cross-sectional views of different portions of the IC device 200. Specifically, FIG. 6 illustrates a cross-sectional view showing the gate via VG1, whereas FIG. 7 illustrates a cross-sectional view showing the gate vias VG2 and VG3. In addition to showing the gate vias VG1-VG3, FIGS. 6-7 also illustrate additional layers of the interconnect structure, such as the M2 (metal-2) layer and M3 (metal-3) layer, as well as the vias V2 interconnecting the M1 and M2 layers and the vias V3 interconnecting the M2 and M3 layers. Dielectric gate structures (e.g., the dummy gate structures 280-282) are also shown in FIGS. 6-7.

As shown in FIG. 6, the gate via VG1 is formed over a fin structure that protrudes over a well region. The gate, source, and drain of transistors are formed by portions of the fin structure. Slot contacts are disposed adjacent to the gate via VG1 on both sides, and hence VG1 has the smallest lateral dimension out of the gate vias VG1-VG3. In comparison, the gate via VG2-VG3 are located over an STI (e.g., an isolation structure) region, and there are no slot contacts formed on either side of the gate via VG2, and the gate via VG3 has a slot contact formed on its left side but not the right side. As such, the gate via VG2 has the biggest size out of the gate vias VG1-VG3, and the gate via VG1 has the smallest size out of the gate vias VG1-VG3. Note that the gate via VG3 is also shifted to the right with respect to the gate located underneath, so as to further minimize bridging risks with the slot contact located to its left.

Figure 8:
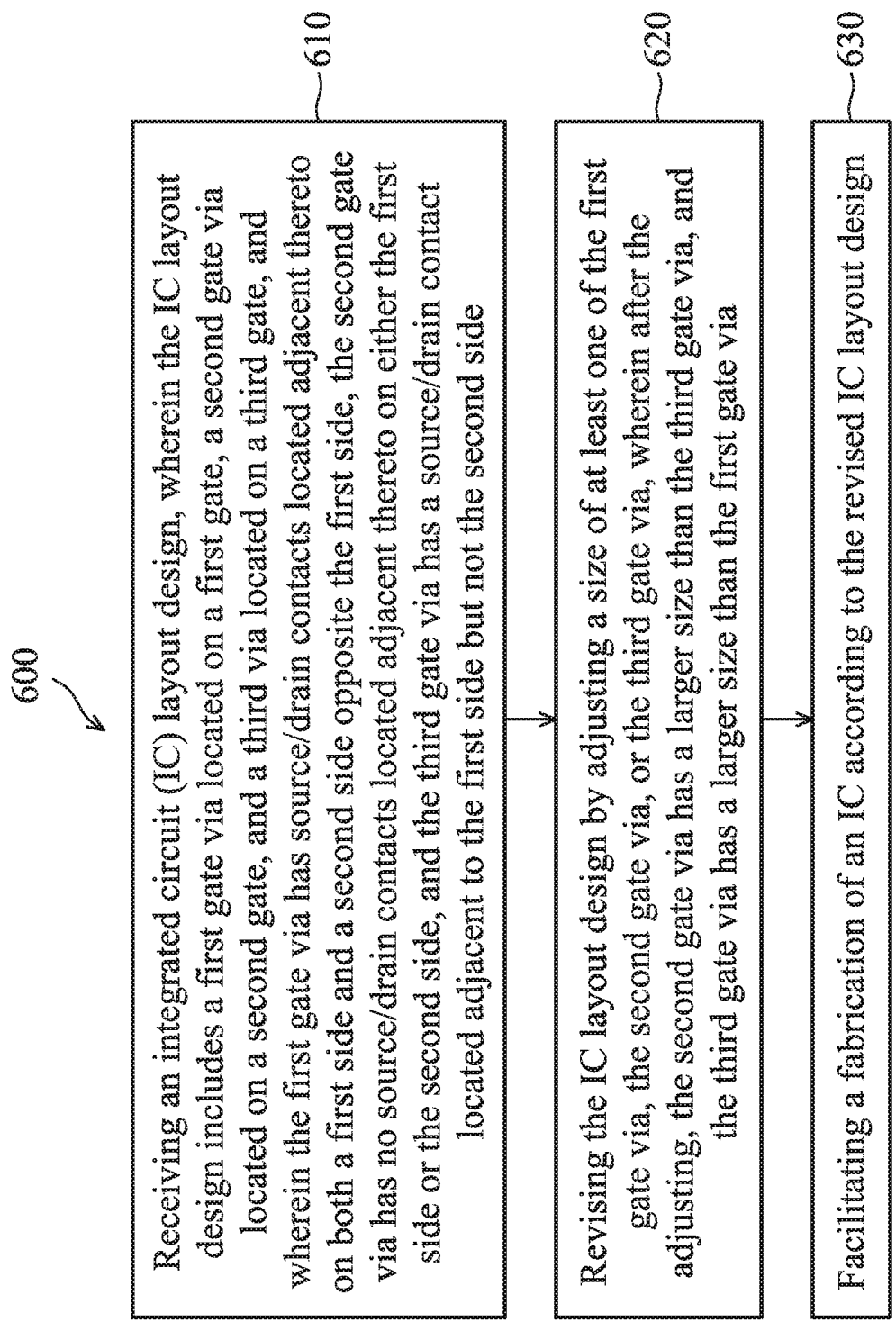
FIG. 8 illustrates a flowchart illustrating a method according to embodiments of the present disclosure.

FIG. 8 is a flowchart illustrating a method 600 according to an embodiment of the present disclosure. The method 600 includes a step 610 of receiving an integrated circuit (IC) layout design. The IC layout design includes a first gate via located on a first gate, a second gate via located on a second gate, and a third gate via located on a third gate. The first gate via has source/drain contacts located adjacent thereto on both a first side and a second side opposite the first side. The second gate via has no source/drain contacts located adjacent thereto on either the first side or the second side. The third gate via has a source/drain contact located adjacent to the first side but not the second side.

The method 600 includes a step 620 of revising the IC layout design by adjusting a size of at least one of the first gate via, the second gate via, or the third gate via. After the adjusting, the second gate via has a larger size than the third gate via, and the third gate via has a larger size than the first gate via.

The method 600 includes a step 630 of facilitating a fabrication of an IC according to the revised IC layout design.

In some embodiments, the first gate via, the second gate via, and the third gate via have substantially similar sizes before the revising step 620 is performed.

In some embodiments, the revising further comprises shifting a location of the third gate via with respect to the third gate in a direction away from the source/drain contact that is located adjacent to the first side of the third gate via.

In some embodiments, the received IC layout design further includes a plurality of drain vias and source vias, and the revising further comprises modifying a size or shape of one or more of the source vias such that the modified source vias each have a larger size than each of the drain vias.

In some embodiments, the drain vias each have a circular or elliptical top view profile, and wherein the modifying comprises configuring at least one of the source vias to have an elongated top view profile that spans across multiple source/drain contacts.

It is understood that additional processes may be performed before, during, or after the steps 610-630 of the method 600. For reasons of simplicity, these additional steps are not discussed herein in detail.

FIG. 9 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products; the entity 706 represents an engineer, such as a processing engineer to control process and the relevant recipes, or an equipment engineer to monitor or tune the conditions and setting of the processing tools; the entity 708 represents a metrology tool for IC testing and measurement; the entity 710 represents a semiconductor processing tool; the entity 712 represents a virtual metrology module associated with the processing tool 710; the entity 714 represents an advanced processing control module associated with the processing tool 710 and additionally other processing tools; and the entity 716 represents a sampling module associated with the processing tool 710.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks, such as the tasks associated with optimizing the CMP process controls as discussed above.

The integrated circuit fabrication system 700 enables interaction among the entities for the purpose of integrated circuit (IC) manufacturing, as well as advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The integrated circuit fabrication system 700 may be used to perform the method 600 discussed above with reference to FIG. 8. For example, one or more of the entities 702-716 may receive an IC layout design from a design house and thereafter revise the received IC layout design by resizing and/or moving the gate vias, and/or by reconfiguring the shapes or sizes of the source vias, as discussed above with reference to FIGS. 3-4.

Based on the above discussions, it can be seen that the present disclosure offers advantages over conventional devices. It is understood, however, that other embodiments may offer additional advantages, and not all advantages are necessarily disclosed herein, and that no particular advantage is required for all embodiments. One advantage is that by implementing gate vias and/or source/drain vias with varying sizes and/or locations, the present disclosure reduces risks of electrical bridging while achieving resistance reduction when possible. For example, both sides of the gate via VG1 has source/drain contacts located adjacent thereto. Therefore, the gate via VG1 has the smallest size among the gate vias so as to avoid electrical bridging with the source/drain contacts. The gate via VG2 has no source/drain contacts located adjacent thereto. Therefore, the gate via VG2 has the largest size among the gate vias (since bridging is not a big concern), which reduces its resistance. The reduced resistance translates into faster speeds. The gate via VG3 has a source/drain contact located adjacent to one side but not the other side. Therefore, the gate via VG3 has an intermediate size among the vias, which reduces bridging risks as well as resistance. The gate via VG3 is also shifted in its location (e.g., away from the source/drain contact), which further reduces bridging risks. Such a configuration discussed above also incurs no additional area penalties, meaning the layout area need not be expanded to implement the aspects of the present disclosure. In addition, a circuit designer or layout engineer may have more freedom in terms of choosing different types of VG vias, which allows for the co-optimization of chip density and performance. Other advantages include compatibility with existing fabrication process flow and ease of implementation.

One aspect of the present disclosure pertains to a semiconductor device. The semiconductor device includes: a first gate structure, a second gate structure, and a third gate structure that each extend in a first direction; a first gate via disposed on the first gate structure, the first gate via having a first size; a second gate via disposed on the second gate structure, the second gate via having a second size that is greater than the first size; a third gate via disposed on the third gate structure, the third gate via having a third size that is less than the second size but greater than the first size; a first source contact disposed adjacent to a first side of the first gate via; a first drain contact disposed adjacent to a second side of the first gate via opposite the first side; and a second drain contact is disposed adjacent to a first side of the third gate via.

Another aspect of the present disclosure pertains to a semiconductor device. The semiconductor device includes: a first gate structure, a second gate structure, and a third gate structure that each extend in a first direction; a plurality of fin structures that each extend in a second direction perpendicular to the first direction, wherein the fin structures are each wrapped around by the first gate structure, the second gate structure, and third gate structure; a first gate via disposed on the first gate structure, the first gate via having a first dimension, wherein the first gate via overlap with one of the fin structures in a top view; a second gate via disposed on the second gate structure, the second gate via having a second dimension that is greater than the first dimension, wherein the second gate via does not overlap with any of the fin structures in the top view; and a third gate via disposed on the third gate structure, the third gate via having a third dimension that is less than the second dimension but greater than the first dimension, wherein the second gate via does not overlap with any of the fin structures in the top view; and a plurality of source/drain contacts that each extend in the first direction; wherein: both a first side and a second side of the first gate via have source/drain contacts located adjacent thereto, wherein the first side and the second side are opposite one another in the second direction; neither the first side nor the second side of the second gate via has source/drain contacts located adjacent thereto; and the first side but not the second side of the third gate via has one of the source/drain contacts located adjacent thereto.

Yet another aspect of the present disclosure pertains to a method. The method includes: receiving an integrated circuit (IC) layout design, wherein the IC layout design includes a first gate via located on a first gate, a second gate via located on a second gate, and a third via located on a third gate, and wherein the first gate via has source/drain contacts located adjacent thereto on both a first side and a second side opposite the first side, the second gate via has no source/drain contacts located adjacent thereto on either the first side or the second side, and the third gate via has a source/drain contact located adjacent to the first side but not the second side; and revising the IC layout design by adjusting a size of at least one of the first gate via, the second gate via, or the third gate via, wherein after the adjusting, the second gate via has a larger size than the third gate via, and the third gate via has a larger size than the first gate via.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a first gate structure, a second gate structure, and a third gate structure that each extend in a first direction;
a first gate via disposed on the first gate structure, the first gate via having a first size;
a second gate via disposed on the second gate structure, the second gate via having a second size that is greater than the first size;
a third gate via disposed on the third gate structure, the third gate via having a third size that is less than the second size but greater than the first size;
a first source contact disposed adjacent to a first side of the first gate via;
a first drain contact disposed adjacent to a second side of the first gate via opposite the first side; and
a second drain contact is disposed adjacent to a first side of the third gate via;
wherein:
the first gate structure, the first gate via, the second gate structure, and the second gate via are components of a first circuit cell;
the third gate structure and the third gate via are components of a second circuit cell; and
the first circuit cell and the second circuit cell are different types of circuit cells.

2. The semiconductor device of claim 1, wherein:
no source contact or drain contact is disposed adjacent to a first side or a second side of the second gate via; and
no source contact or drain contact is disposed adjacent to a second side of the third gate via that is opposite the first side.

3. The semiconductor device of claim 1, wherein:
the semiconductor device further includes a plurality of fin structures that each extend in a second direction different from the first direction;
the first, second, and third gate structures each wrap around the fin structures;
the first gate via is disposed over one of the fin structures; and
the second gate via and the third gate via are not disposed over any of the fin structures.

4. The semiconductor device of claim 1, wherein the third gate via is shifted with respect to the third gate structure in a direction away from the second drain contact.

5. The semiconductor device of claim 1, wherein the first source contact has a larger dimension in the first direction than the first drain contact.

6. The semiconductor device of claim 1, wherein the semiconductor device further includes:
a plurality of first metal lines and second metal lines of an interconnect structure, wherein the first metal lines and second metal lines each extend in a second direction different from the first direction;
a plurality of drain contacts that include the first drain contact and the second drain contact, wherein the drain contacts each extend in the first direction;
a plurality of source contacts that include the first source contact, wherein the sources contacts each extend in the first direction;
a plurality of drain vias that are disposed between, and electrically coupled to, the drain contacts and the first metal lines; and a plurality of source vias that are disposed between, and electrically coupled to, the source contacts and the second metal lines, wherein a size of each of the source vias is substantially greater than a size of each of the drain vias.

7. The semiconductor device of claim 6, wherein:
each of the drain vias has a circular or elliptical top view profile; and
each of the source vias has an elongated top view profile, the source vias each being elongated in the second direction and each being electrically coupled to multiple ones of the source contacts.

8. The semiconductor device of claim 6, wherein:
each of the drain vias has a first circular or first elliptical top view profile;
each of the source vias has a second circular or second elliptical top view profile; and
a dimension of each of the source vias in a top view is at least 1.5 times a dimension of each of the drain vias in the second direction.

9. A semiconductor device, comprising:
a first gate structure, a second gate structure, and a third gate structure that each extend in a first direction;
a plurality of fin structures that each extend in a second direction perpendicular to the first direction, wherein the fin structures are each wrapped around by the first gate structure, the second gate structure, and third gate structure;
a first gate via disposed on the first gate structure, the first gate via having a first dimension, wherein the first gate via overlap with one of the fin structures in a top view;
a second gate via disposed on the second gate structure, the second gate via having a second dimension that is greater than the first dimension, wherein the second gate via does not overlap with any of the fin structures in the top view; and
a third gate via disposed on the third gate structure, the third gate via having a third dimension that is less than the second dimension but greater than the first dimension, wherein the third gate via does not overlap with any of the fin structures in the top view; and
a plurality of source/drain contacts that each extend in the first direction;
wherein:
both a first side and a second side of the first gate via have source/drain contacts located adjacent thereto, wherein the first side and the second side are opposite one another in the second direction;
neither a first side nor a second side of the second gate via has source/drain contacts located adjacent thereto; and
a first side but not a second side of the third gate via has one of the source/drain contacts located adjacent thereto.

10. The semiconductor device of claim 9, wherein a center of the third gate via is offset with respect to a center of the third gate structure in the second direction away from the one of the source/drain contacts that is located adjacent thereto.

11. The semiconductor device of claim 9, wherein:
a first subset of the source/drain contacts include source contacts;
a second subset of the source/drain contacts include drain contacts; and
the source contacts and the drain contacts have different dimensions in the first direction.

12. The semiconductor device of claim 9, wherein the semiconductor device further includes a drain via and a source via, wherein the source via has a larger area in the top view than the drain via.

13. The semiconductor device of claim 12, wherein:
the drain via has a circular or elliptical top view profile; and
the source via has a rectangular top view profile that is elongated in the second direction.

14. A semiconductor device, comprising:
a first gate structure, a second gate structure, and a third gate structure that each extend in an elongated manner in a first direction;
a plurality of fin structures that each extend in an elongated manner in a second direction that is different from the first direction, wherein the fin structures each intersect with one or more of the first, second, and third gate structures in a top view;
a first gate via disposed over the first gate structure and over one of the fin structures, the first gate via having a first size;
a second gate via disposed over the second gate structure but not over any of the fin structures, the second gate via having a second size that is greater than the first size;
a third gate via disposed over the third gate structure but not over any of the fin structures, the third gate via having a third size that is less than the second size but greater than the first size;
a first source contact disposed adjacent to a first side of the first gate via;
a first drain contact disposed adjacent to a second side of the first gate via opposite the first side, wherein the first drain contact is smaller than the first source contact in the first direction; and
a second drain contact is disposed adjacent to a first side of the third gate via.

15. The semiconductor device of claim 14, wherein:
no source contact or drain contact is disposed adjacent to a first side or a second side of the second gate via in the second direction; and
no source contact or drain contact is disposed adjacent to a second side of the third gate via that is opposite the first side in the second direction.

16. The semiconductor device of claim 14, wherein the third gate via is at least partially misaligned with the third gate structure.

17. The semiconductor device of claim 14, wherein:
the semiconductor device includes a first circuit cell and a second circuit cell that is a different type of circuit cell than the first circuit cell;
the first circuit cell includes the first gate, the first gate via, the second gate, and the second gate via; and
the second circuit cell includes the third gate and the third gate via.

18. The semiconductor device of claim 14, wherein the semiconductor device further includes:
a plurality of first metal lines and second metal lines of an interconnect structure, wherein the first metal lines and second metal lines each extend in the second direction;
a plurality of drain contacts that include the first drain contact and the second drain contact, wherein the drain contacts each extend in the first direction;
a plurality of source contacts that include the first source contact, wherein the sources contacts each extend in the first direction;

a plurality of drain vias that are disposed between, and electrically coupled to, the drain contacts and the first metal lines; and a plurality of source vias that are disposed between, and electrically coupled to, the source contacts and the second metal lines, wherein a size of each of the source vias is substantially greater than a size of each of the drain vias.

19. The semiconductor device of claim 18, wherein:

each of the drain vias has a circular or elliptical top view profile; and each of the source vias has one of:
- an elongated top view profile, the source vias each being elongated in the second direction and each being electrically coupled to multiple ones of the source contacts; or
- a second circular top view profile or a second elliptical top view profile.

20. The semiconductor device of claim 9, wherein:

the first gate structure, the first gate via, the second gate structure, and the second gate via are components of a first circuit cell;

the third gate structure and the third gate via are components of a second circuit cell; and the first circuit cell and the second circuit cell are different types of circuit cells.

* * * * *